United States Patent
Do et al.

(10) Patent No.: US 8,048,776 B2
(45) Date of Patent: Nov. 1, 2011

(54) SEMICONDUCTOR DEVICE AND METHOD OF SUPPORTING A WAFER DURING BACKGRINDING AND REFLOW OF SOLDER BUMPS

(75) Inventors: Byung Tai Do, Singapore (SG); Heap Hoe Kuan, Singapore (SG); Yaojian Lin, Singapore (SG); Rui Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 556 days.

(21) Appl. No.: 12/036,000

(22) Filed: Feb. 22, 2008

(65) Prior Publication Data

US 2009/0212429 A1 Aug. 27, 2009

(51) Int. Cl.
*H01L 21/30* (2006.01)

(52) U.S. Cl. .................. 438/459; 438/55; 257/E21.508; 257/E21.483; 257/E21.513

(58) Field of Classification Search .................. 438/454, 438/55, 459; 257/E21.508, E21.502, E21.483, 257/E21.512, E21.513, E21.505; 216/12, 216/53

See application file for complete search history.

(56) References Cited

U.S. PATENT DOCUMENTS

| | | | |
|---|---|---|---|
| 6,263,566 B1 * | 7/2001 | Hembree et al. | 29/874 |
| 7,141,487 B2 | 11/2006 | Periasamy et al. | |
| 2002/0084248 A1 * | 7/2002 | Kong et al. | 216/35 |
| 2002/0137325 A1 * | 9/2002 | Shao | 438/613 |
| 2003/0102158 A1 * | 6/2003 | Jimarez et al. | 174/261 |
| 2004/0005770 A1 * | 1/2004 | Farnworth et al. | 438/612 |
| 2005/0196939 A1 * | 9/2005 | Lee et al. | 438/460 |
| 2005/0253261 A1 * | 11/2005 | Farnworth | 257/734 |
| 2008/0113456 A1 * | 5/2008 | Codding et al. | 438/14 |

* cited by examiner

*Primary Examiner* — Caridad Everhart
(74) *Attorney, Agent, or Firm* — Robert D. Atkins; Patent Law Group

(57) ABSTRACT

A semiconductor device is made by providing a semiconductor wafer having an active surface, forming an under bump metallization layer on the active surface of the semiconductor wafer, forming a first photosensitive layer on the active surface of the semiconductor wafer, exposing a selected portion of the first photosensitive layer over the under bump metallization layer to light, removing a portion of a backside of the semiconductor wafer, opposite to the active surface, prior to developing the exposed portion of the first photosensitive layer, developing the exposed portion of the first photosensitive layer after removing the portion of the backside of the semiconductor wafer, and depositing solder material over the under bump metallization layer to form solder bumps. The remaining portion of the first photosensitive layer is then removed. A second photosensitive layer or metal stencil can be formed over the first photosensitive layer.

24 Claims, 5 Drawing Sheets

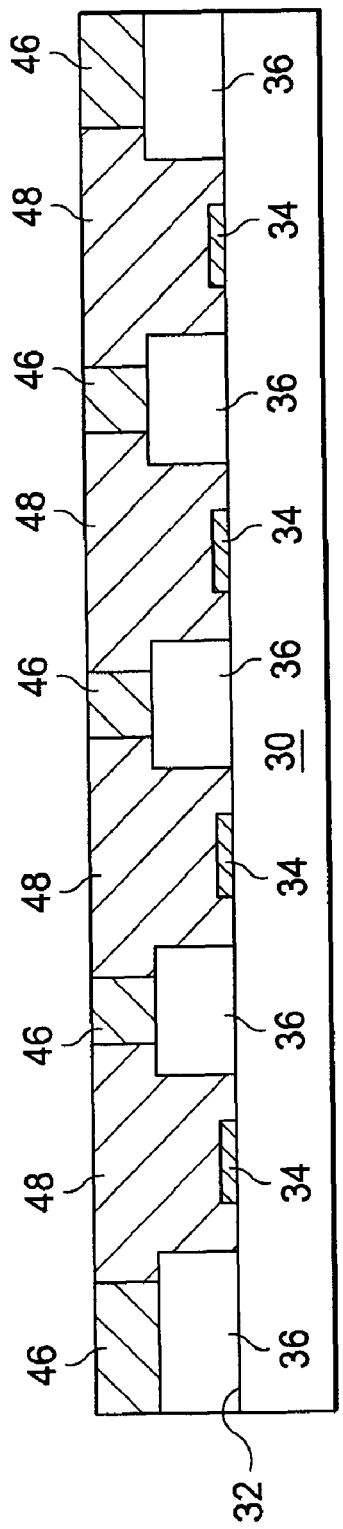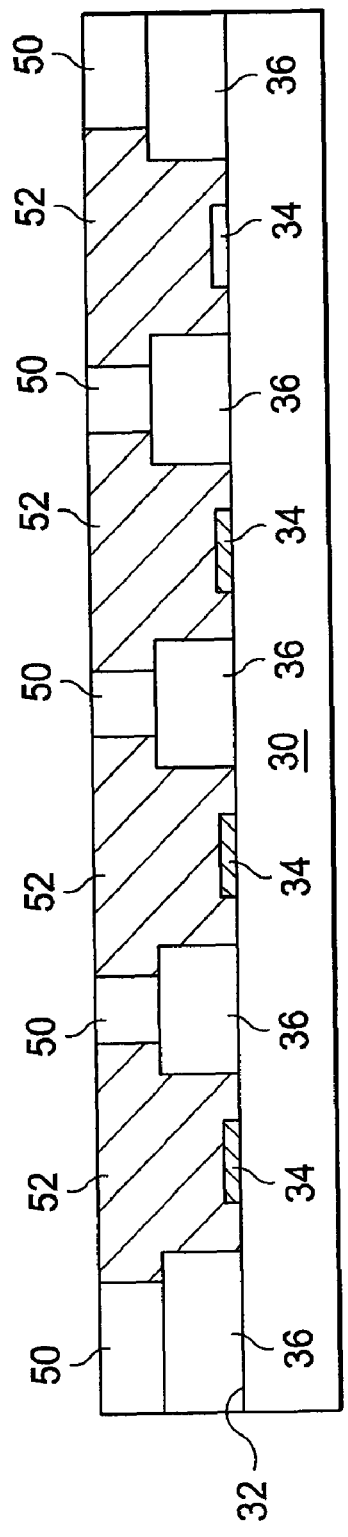

US 8,048,776 B2

SEMICONDUCTOR DEVICE AND METHOD OF SUPPORTING A WAFER DURING BACKGRINDING AND REFLOW OF SOLDER BUMPS

FIELD OF THE INVENTION

The present invention relates in general to semiconductor devices and, more particularly, to a semiconductor device and method of supporting a wafer having large solder bumps during wafer backgrinding and solder reflow processes.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

Some applications utilize large solder bumps, while other applications require thin wafers to reduce die and package thickness. The thin wafers are made by backgrinding conventional wafers to the desired thickness. The wafer backgrind is typically done before the solder bumps are formed. In applications requiring both large solder bumps and thin wafers, wafer warpage or breakage is a recurring design issue in view of the bump height variation and stress of reflowing the large solder bumps on the thin wafer, as well as using known front-side support structures during backgrinding. One known approach uses a thick tape covering the active surface of the wafer after solder bump attachment for the front-side structural support during backgrinding. However, the tape is costly to use and adds manufacturing steps to apply and remove. The removal of the front-side tape, typically by mechanical peel prior to flip chip attachment, may break a thin wafer.

A need exists to form large solder bumps on thin wafers without causing wafer warpage or breakage.

SUMMARY OF THE INVENTION

In one embodiment, the present invention is a method of making a semiconductor device comprising the steps of providing a semiconductor wafer having an active surface, forming an under bump metallization layer over the active surface of the semiconductor wafer, forming a first photosensitive layer over the active surface of the semiconductor wafer and under bump metallization layer, exposing a selected portion of the first photosensitive layer to light, removing a portion of a backside of the semiconductor wafer, opposite to the active surface, prior to developing the exposed portion of the first photosensitive layer, developing the exposed portion of the first photosensitive layer after removing the portion of the backside of the semiconductor wafer, and depositing solder material over the under bump metallization layer to form solder bumps.

In another embodiment, the present invention is a method of making a semiconductor device comprising the steps of providing a semiconductor wafer having an active surface, forming an under bump metallization layer over the active surface of the semiconductor wafer, forming a first photosensitive layer over the active surface of the semiconductor wafer, removing a portion of a backside of the semiconductor wafer, opposite to the active surface, removing the first photosensitive layer after removing the portion of the backside of the semiconductor wafer, and depositing solder material over the under bump metallization layer to form solder bumps.

In another embodiment, the present invention is a method of making a semiconductor package comprising the steps of providing a semiconductor wafer having an active surface, forming a first layer over the active surface of the semiconductor wafer for structural support, removing a portion of a backside of the semiconductor wafer, opposite to the active surface, and removing the first layer after removing the portion of the backside of the semiconductor wafer.

In another embodiment, the present invention is a semiconductor device comprising a semiconductor wafer having an active surface. An under bump metallization layer is formed over the active surface of the semiconductor wafer. A first photosensitive layer is formed over the active surface of the semiconductor wafer. A portion of a backside of the semiconductor wafer, opposite to the active surface, is removed. The first photosensitive layer is removed after removing the portion of the backside of the semiconductor wafer. A plurality of solder bumps is formed over the under bump metallization layer.

BRIEF DESCRIPTION OF THE DRAWINGS

FIG. 3 illustrates a semiconductor wafer after backgrind using a metal stencil for support the wafer during solder printing;

FIG. 4 illustrates a semiconductor wafer after backgrind using a second photosensitive dry film layer to support the wafer during solder reflow;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
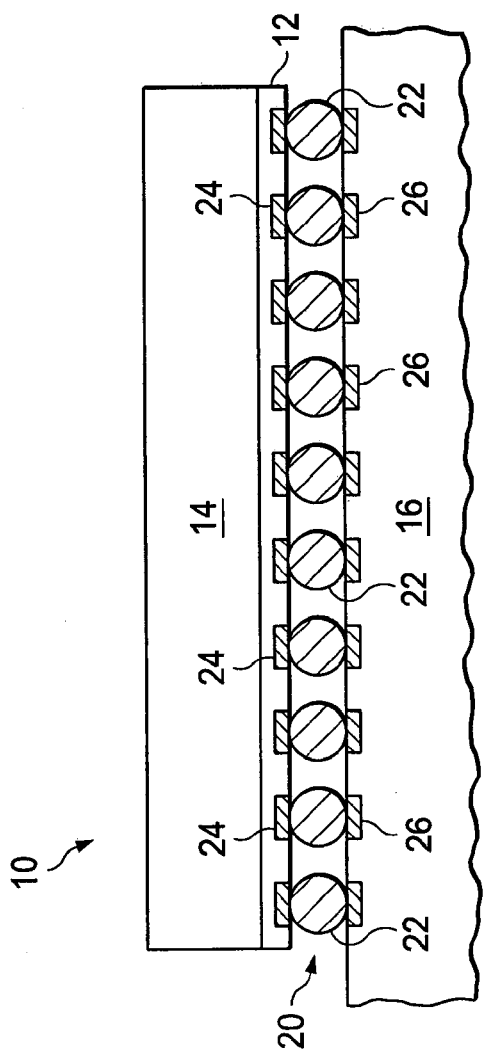
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive device formed within active area 12 and may be electrically interconnected. For example, an analog circuit may include one or more inductor, capacitor and resistor formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Figure 2A:
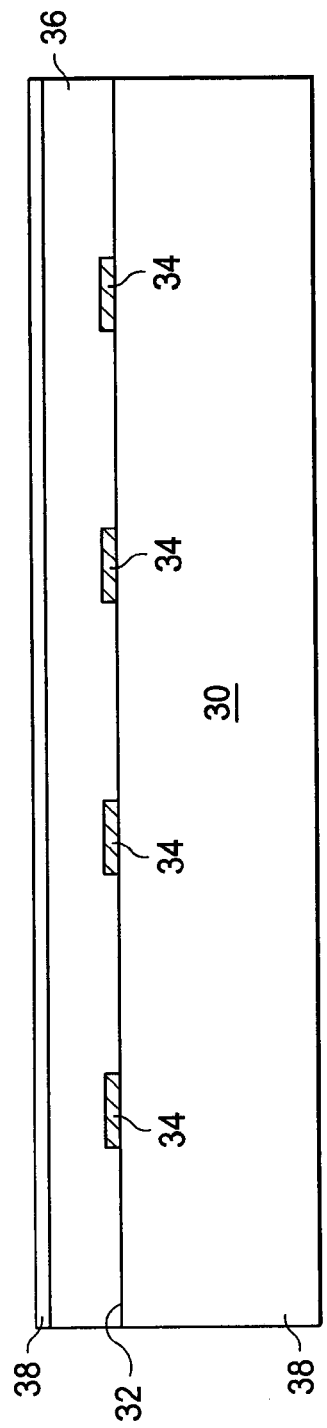
FIGS. 2A-2F illustrate a semiconductor wafer having photosensitive dry film layer to support the wafer during backgrinding.

Further detail of forming semiconductor device 10 is shown in FIGS. 2A-2F. In FIG. 2A, semiconductor wafer 30 is made of silicon or other bulk semiconductor material. Semiconductor wafer 30 has an original thickness of about 29 mils or 737 µm. In one embodiment, wafer 30 includes a plurality of semiconductor die each having active devices and integrated passive devices (IPD), conductive layers, and dielectric layers formed on active surface 32 according to the electrical design of the die. In particular, a metal layer is deposited over wafer 30 using an evaporation, electrolytic plating, electroless plating, or screen printing process to form under bump metallization (UBM) layer 34. UBM 34 can be made with titanium (Ti), nickel (Ni), nickel vanadium (NiV), copper (Cu), or Cu alloy. UBM 34 connects to contact pads and conductor layers in active surface 32 to provide the electrical interconnect for the semiconductor die. A solder bump structure will be formed on UBM 34. In some applications, the solder bump structure is relatively large, on the order of 150 µm and more.

A photosensitive dry film layer 36 is laminated in one or more layers on active surface 32. Photosensitive dry film layer 36 can also be deposited by spin-coating, spray-coating, and printing. Photosensitive dry film layer 36 can be made with photosensitive polymer resin with proper adhesion to wafer passivation. The thickness of photosensitive dry film layer 36 is, in part, determined by the desired height of the solder bumps. For solder bumps having a height of 150 µm, the thickness of photosensitive dry film layer 36 can be selected as about 100 µm. An optional transparent protective tape 38 can be placed over photosensitive film layer 36.

Figure 2B:
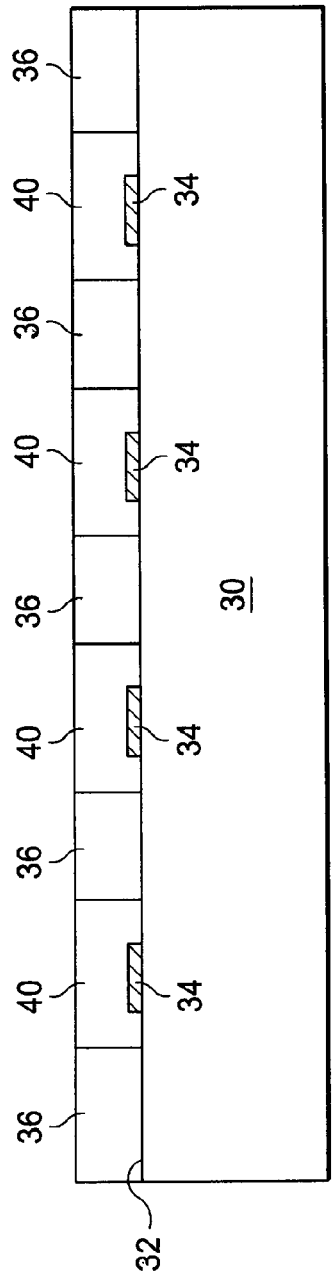
Figure 2C:
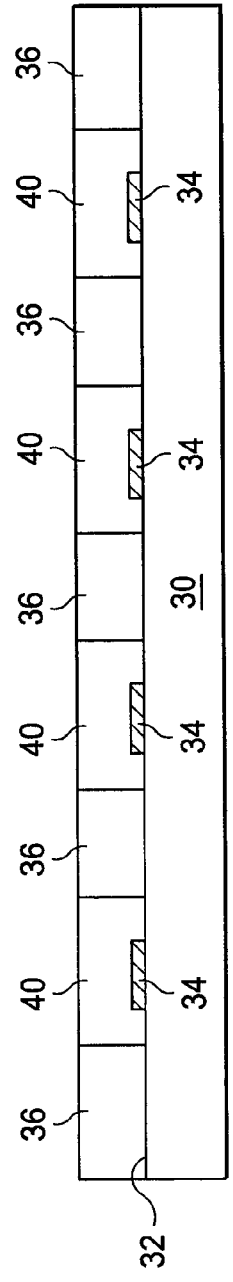

FIG. 2B shows areas 40 of photosensitive dry film layer 36 patterned and exposed to ultraviolet (UV) or other short wavelength light. Areas 40 correspond to the regions around UBM 34. The exposed areas 40 are not yet developed in FIG. 2B.

It is desired to make semiconductor wafer 30 a thin wafer. Accordingly, in FIG. 2C, a backside of semiconductor wafer 30, opposite active surface 32, undergoes coarse backgrinding using a mechanical grinder. Note that the backgrinding occurs after exposure of areas 40 of photosensitive dry film layer 36, but prior to development of the exposed film. An additional wet etching step can be used for a finer removal of the bulk wafer material. Alternatively, plasma etching and/or a chemical-mechanical planarization (CMP) process can be used to remove a portion of the backside of wafer 30. The photosensitive dry film layer 36, as well as optional transparent protective tape 38 if used, provide structural support of the wafer during the backgrinding process. The backgrind reduces the thickness of semiconductor wafer 30 to about 300 µm or less.

Figure 2D:
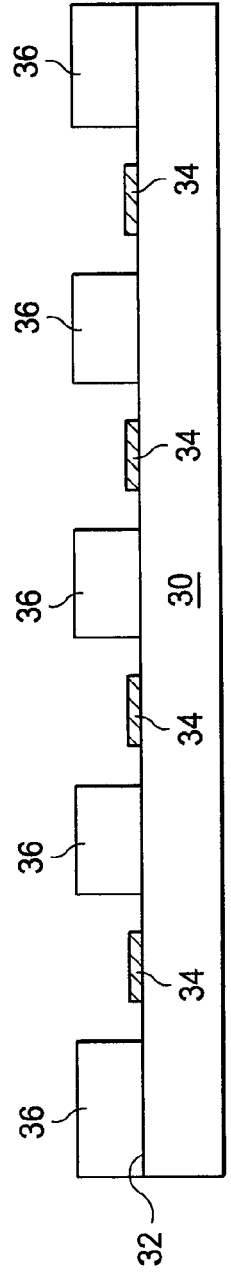
Figure 2E:
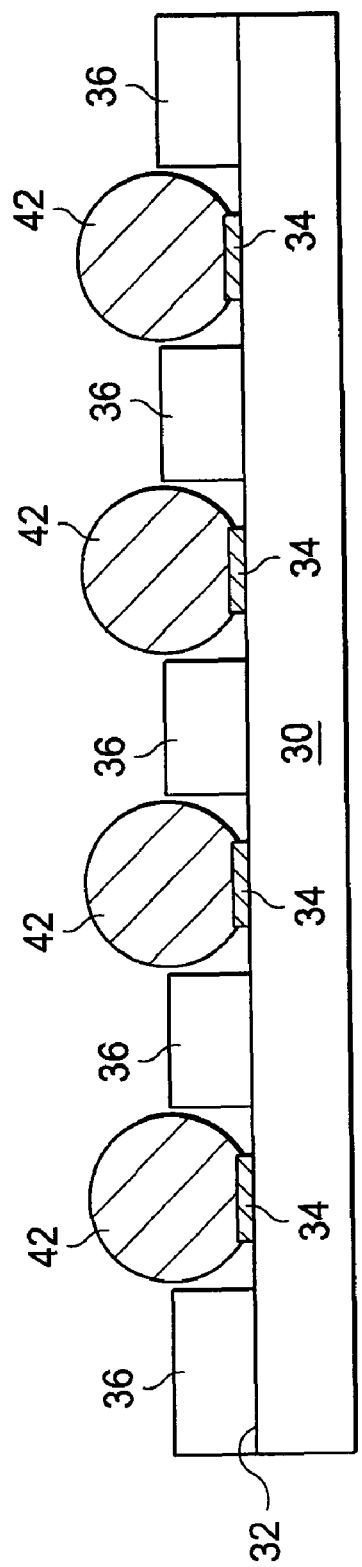
Figure 2F:
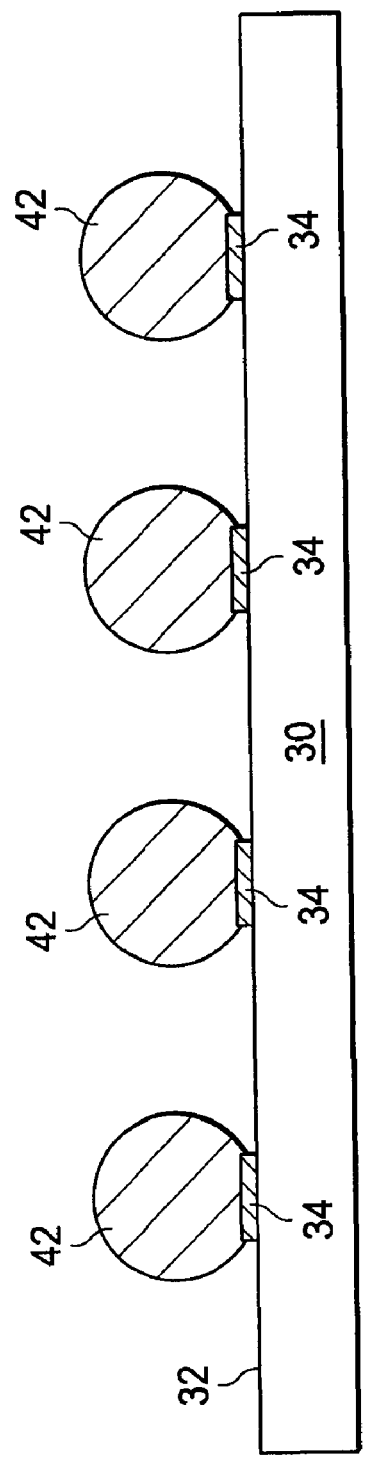

In FIG. 2D, exposed areas 40 are developed to remove film material from areas 40 and expose UBM 34 after wafer backgrinding. Wafer 30 has an effective thickness that includes the remaining portions of photosensitive dry film layer 36 after the film is developed. An electrically conductive solder material is deposited over UBM 34 through an evaporation, electrolytic plating, electroless plating, ball drop, or screen printing process. The solder material can be any metal or electrically conductive material, e.g., tin (Sn), nickel (Ni), gold (Au), silver (Ag), lead (Pb), bismuthinite (Bi) and alloys thereof. For example, the solder material can be eutectic Sn/Pb, high lead, lead free, or other solder materials. The solder material is reflowed by heating the conductive material above its melting point to form spherical balls or bumps 42, as shown in FIG. 2E. The height of solder bumps 42 is about 150 μm. In some applications, solder bumps 42 are reflowed a second time to improve electrical contact to UBM 34. The remaining portion of photosensitive dry film layer 36 is removed or stripped using a flux clean process, as shown in FIG. 2F. Alternatively, to reduce the risk of wafer breakage, the dry film need not be stripped but can remain on active surface 32 for the final product. In this case, the dry film can be used as a solder mask after final curing with either heat or UV. The solder bumps 42 provide an interconnect structure for the semiconductor die according to its functional design.

As a feature of the present invention, the photosensitive dry film layer 36 provides structural support for wafer 30 during the backgrinding process. Since the large solder bumps have not yet been formed during backgrinding, the backside surface of the wafer remains uniform which reduces the potential of wafer breakage during backgrinding. In addition, the portion of photosensitive dry film layer 36 remaining after development provides structural support for the wafer during solder reflow. The effective thickness of the wafer is increased or enhanced by the presence of photosensitive dry film layer 36. That is, the effective thickness of the wafer is the combination of wafer 30 after backgrinding and the remaining portion of photosensitive dry film layer 36 after development. The enhanced wafer thickness due to the dry film layer increases wafer strength during the solder reflow process, which decreases wafer warpage and wafer breakage.

In FIG. 3, semiconductor wafer 30 is made similar to the process described in FIGS. 2A-2D. More specifically, UBM 34 is deposited on wafer 30 to accommodate large solder bump structures. A photosensitive dry film layer 36 is laminated in one or more layers on active surface 32. The thickness of photosensitive dry film layer 36 is, in part, determined by the desired height of the solder bumps. A portion of the photosensitive dry film layer around UBM 34 is exposed but not developed. The backside of semiconductor wafer 30, opposite active surface 32, undergoes backgrinding using a mechanical grinder and wet etching. The photosensitive dry film layer 36 provides structural support for the wafer during the backgrinding process. After backgrinding, a metal stencil 46 with openings is deposited over photosensitive dry film layer 36. The openings in photosensitive dry film layer 36 can be larger, smaller, or same the size as the openings in metal stencil 46. The open areas around metal stencil 46 and photosensitive dry film layer 36 over UBM 34 is filled with solder paste 48. The metal stencil 46 is removed from wafer. Solder paste 48 is reflowed by heating the conductive material above its melting point to form spherical balls or bumps. The remaining portion of photosensitive dry film layer 36 are removed or stripped using a flux clean process, similar to FIG. 2F. The solder bumps provide an interconnect structure for the semiconductor die according to its functional design.

The photosensitive dry film layer 36 provides structural support for wafer 30 during the backgrinding process. Since the large solder bumps have not yet been formed during backgrinding, the backside surface of the wafer remains uniform which reduces the potential of wafer breakage during backgrinding. In addition, the portion of photosensitive dry film layer 36 remaining after development provides structural support for wafer 30 during solder reflow. The effective thickness of the wafer is increased or enhanced by the presence of photosensitive dry film layer 36. That is, the effective thickness of the wafer is the combination of wafer 30 after backgrinding and the remaining portion of photosensitive dry film layer 36 after development and etching. The enhanced wafer thickness due to the dry film layer increases wafer strength during the solder reflow process, which decreases wafer warpage and wafer breakage.

In FIG. 4, semiconductor wafer 30 is made similar to the process described in FIGS. 2A-2D. More specifically, UBM 34 is deposited on wafer 30 to accommodate large solder bump structures. A photosensitive dry film layer 36 is laminated in one or more layers on active surface 32. The thickness of photosensitive dry film layer 36 is, in part, determined by the desired height of the solder bumps. A portion of the photosensitive dry film layer around UBM 34 is exposed but not developed. The backside of semiconductor wafer 30, opposite active surface 32, undergoes backgrinding using a mechanical grinder and wet etching. The photosensitive dry film layer 36 provides structural support for the wafer during the backgrinding process. After backgrinding, a second photosensitive dry film layer 50 is formed over photosensitive dry film layer 36. The portions of photosensitive dry film layers 36 and 50 over UBM 34 are removed by etching. The opening in photosensitive dry film layer 36 can be larger, smaller, or the same size as the opening in photosensitive dry film layer 50. The open areas around photosensitive dry film layers 36 and 50 is filled with solder paste 52. Solder paste 52 is reflowed by heating the conductive material above its melting point to form spherical balls or bumps. The remaining portion of photosensitive dry film layer 36 and 50 is removed or stripped using a flux clean process, similar to FIG. 2F. The solder bumps provide an interconnect structure for the semiconductor die according to its functional design.

As an alternative method, a ball attachment process can be used to form the solder bumps. First, a flux material is applied on UBM 34. Next, solder material is dropped into open areas around photosensitive dry film layers 36 and 50 over UBM 34. The solder material is reflowed above its melting point to form the solder bumps.

The photosensitive dry film layer 36 provides structural support for wafer 30 during the backgrinding process. Since the large solder bumps have not yet been formed during backgrinding, the backside surface of the wafer remains uniform which reduces the potential of wafer breakage during backgrinding. In addition, the portions of photosensitive dry film layers 36 and 50 remaining after development provides structural support for wafer 30 during solder reflow. The effective thickness of the wafer is increased or enhanced by the presence of photosensitive dry film layers 36 and 50. That is, the effective thickness of the wafer is the combination of wafer 30 after backgrinding and the remaining portion of photosensitive dry film layers 36 and 50 after development. The enhanced wafer thickness due to the dry film layer increases wafer strength during the solder reflow process, which decreases wafer warpage and wafer breakage.

Figure 5:
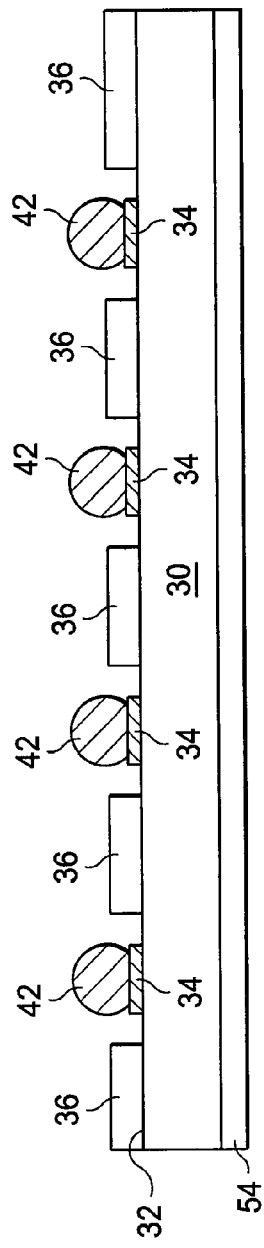
FIG. 5 illustrates a protective layer applied to the backside of the semiconductor wafer after backgrinding.

FIG. 5 illustrates a protective layer 54 disposed on the backside of wafer 30 after the backgrinding process, e.g., after the process steps of FIG. 2E. The protective layer 54 can be made with epoxy based resin or metal thin film. Protective layer 54 protects semiconductor wafer 30 from chipping in a subsequent dicing process.

Figure 6:
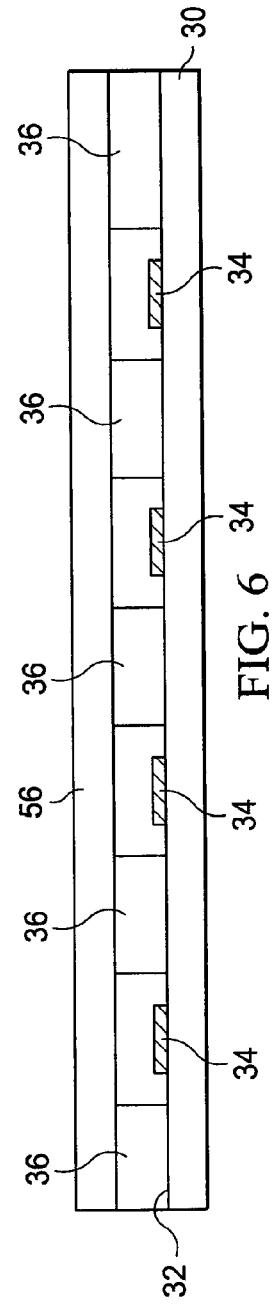
FIG. 6 illustrates backgrinding tape applied to the photosensitive dry film layer to support the wafer during backgrinding.

FIG. 6 illustrates a backgrinding tape 56 applied to undeveloped photosensitive dry film layer 36 prior to the backgrinding process, e.g., after the process steps of FIG. 2B. The backgrinding tape 56 provides further support for semiconductor wafer 30 during backgrinding.

Figure 7:
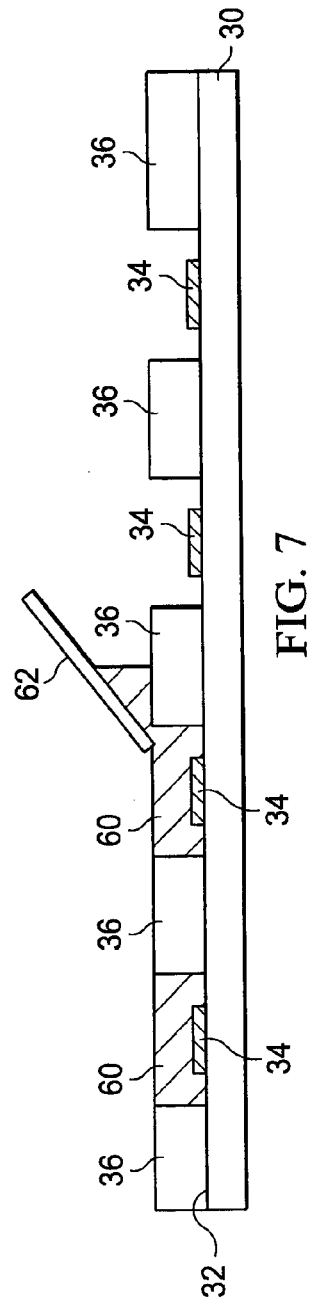
FIG. 7 illustrates filling solder paste in some but not all of the developed openings in the photosensitive dry film layer.

In FIG. 7, the exposed portion of photosensitive dry film layer 36 is developed to remove the film material and expose UBMs 34. Solder paste 60 is deposited in some but not all of the openings in the dry film layer. Barrier 62 blocks solder paste from openings not intended to receive solder paste 60.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor wafer having an active surface;
    forming an under bump metallization layer over the active surface of the semiconductor wafer;
    forming a first photosensitive layer over the active surface of the semiconductor wafer and the under bump metallization layer;
    exposing a selected portion of the first photosensitive layer to light;
    removing a portion of a backside of the semiconductor wafer opposite the active surface after exposing the selected portion of the first photosensitive layer, wherein a surface of the photosensitive layer opposite the active surface is substantially planar across a width of the wafer during the removing of the portion of the backside of the semiconductor wafer;
    removing the selected portion of the first photosensitive layer after removing the portion of the backside of the semiconductor wafer;
    depositing a conductive material over the under bump metallization layer to form a plurality of conductive bumps; and
    removing a remaining portion of the first photosensitive layer after forming the conductive bumps.

2. The method of claim 1, wherein the first photosensitive layer provides structural support while removing the portion of the backside of the semiconductor wafer.

3. The method of claim 1, further including forming a second layer over the first photosensitive layer for providing structural support while removing the portion of the backside of the semiconductor wafer.

4. The method of claim 1, further including disposing a protective layer on the backside of the semiconductor wafer.

5. The method of claim 1, comprising:
    after developing the exposed portion of the first photosensitive layer, depositing a metal stencil layer on the first photosensitive layer; and
    removing the metal stencil layer prior to depositing the conductive material.

6. A method of making a semiconductor device, comprising:
    providing a semiconductor wafer having an active surface;
    forming an under bump metallization layer over the active surface of the semiconductor wafer;
    forming a first photosensitive layer over the active surface of the semiconductor wafer;
    removing a portion of a backside of the semiconductor wafer, opposite to the active surface, wherein a surface of the first photosensitive layer opposite the active surface is substantially planar along an entire width of the semiconductor wafer during the removing of the portion of the backside of the semiconductor wafer;
    removing a selected portion of the first photosensitive layer after removing the portion of the backside of the semiconductor wafer; and
    depositing a conductive material over the under bump metallization layer to form a plurality of conductive bumps.

7. The method of claim 6, wherein the first photosensitive layer provides structural support while removing the portion of the backside of the semiconductor wafer.

8. The method of claim 6, further including forming a second layer over the first photosensitive layer for providing structural support while removing the portion of the backside of the semiconductor wafer.

9. The method of claim 6, further including disposing a protective layer on the backside of the semiconductor wafer.

10. The method of claim 6, further including removing the portion of the backside of the semiconductor wafer after exposing the selected portion of the first photosensitive layer to light.

11. The method of claim 10, further including removing an unexposed portion of the first photosensitive layer after removing the portion of the backside of the semiconductor wafer.

12. A method of making a semiconductor package, comprising:
    providing a semiconductor wafer having an active surface;
    forming a first layer over the active surface of the semiconductor wafer for structural support;
    removing a portion of a backside of the semiconductor wafer that is opposite to the active surface; and
    removing a selected portion of the first layer after removing the portion of the backside of the semiconductor wafer.

13. The method of claim 12, further including forming an under bump metallization layer over the active surface of the semiconductor wafer.

14. The method of claim 13, further including depositing a conductive material over the under bump metallization layer to form a plurality of conductive bumps.

15. The method of claim 12, wherein the first layer includes a first photosensitive layer.

16. The method of claim 12, further including forming a second layer over the first layer for providing structural support while removing the portion of the backside of the semiconductor wafer.

17. The method of claim 12, wherein the step of removing the portion of the backside of the semiconductor wafer includes grinding the backside of the semiconductor wafer.

18. The method of claim 13, further including removing the portion of the backside of the semiconductor wafer after exposing the selected portion of the first layer to light.

19. The method of claim 18, further including removing the exposed portion of the first layer after removing the portion of the backside of the semiconductor wafer.

20. A semiconductor device, comprising:
    a semiconductor wafer having an active surface;
    an under bump metallization layer formed over the active surface of the semiconductor wafer;
    a first photosensitive layer formed over the active surface of the semiconductor wafer;
    a protective layer disposed on the backside of the semiconductor wafer;
    a plurality of bumps formed over the under bump metallization layer.

21. The semiconductor device of claim 20, wherein the first photosensitive layer provides structural support while a portion of the backside of the semiconductor wafer is removed.

22. The semiconductor device of claim 20, further comprising a second photosensitive layer disposed over the first photosensitive layer, wherein the first and second photosensitive layers include a plurality of first and second openings, respectively, the first and second openings exposing the under bump metallization layer, and wherein the second openings are smaller than the first openings.

23. The semiconductor device of claim 21, further including a second layer formed over the first photosensitive layer for providing structural support while the portion of the backside of the semiconductor wafer is removed.

24. The semiconductor device of claim 23, wherein the second layer comprises a transparent protective tape layer.

* * * * *